(12) United States Patent
Pi et al.

(10) Patent No.: US 9,997,252 B2
(45) Date of Patent: Jun. 12, 2018

(54) HIGH SPEED AND LOW POWER SENSE AMPLIFIER

(71) Applicant: Silicon Storage Technology, Inc., San Jose, CA (US)

(72) Inventors: Xiao Yan Pi, Shanghai (CN); Xiaozhou Qian, Shanghai (CN); Kai Man Yue, Shanghai (CN); Yao Zhou, Shanghai (CN); Yaohua Zhu, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days. days.

(21) Appl. No.: 15/706,586

(22) Filed: Sep. 15, 2017

(65) Prior Publication Data

US 2018/0005701 A1   Jan. 4, 2018

Related U.S. Application Data

(62) Division of application No. 14/772,734, filed as application No. PCT/CN2013/072655 on Mar. 15, 2013, now abandoned.

(51) Int. Cl.
| | |
|---|---|
| *G11C 16/06* | (2006.01) |
| *G11C 16/28* | (2006.01) |
| *G11C 16/08* | (2006.01) |
| *G11C 7/14* | (2006.01) |
| *G11C 16/24* | (2006.01) |
| *G11C 7/06* | (2006.01) |
| *G11C 29/02* | (2006.01) |
| *G11C 7/12* | (2006.01) |

(Continued)

(52) U.S. Cl.
CPC ............ *G11C 16/28* (2013.01); *G11C 7/062* (2013.01); *G11C 7/12* (2013.01); *G11C 7/14* (2013.01); *G11C 16/08* (2013.01); *G11C 16/24* (2013.01); *G11C 29/025* (2013.01); *G11C 2029/1204* (2013.01); *G11C 2029/5006* (2013.01)

(58) Field of Classification Search
CPC ........... G11C 16/28; G11C 7/062; G11C 7/12; G11C 7/14; G11C 16/08
USPC ..................................................... 365/185.21
See application file for complete search history.

(56) References Cited

U.S. PATENT DOCUMENTS

| 5,335,198 A | 8/1994 | Van Buskirk |
|---|---|---|
| 5,386,158 A | 1/1995 | Wang |

(Continued)

FOREIGN PATENT DOCUMENTS

| CN | 102044303 A1 | 4/2011 |
|---|---|---|
| EP | 0 851 430 A2 | 7/1998 |

(Continued)

OTHER PUBLICATIONS

PCT Search Report and Written Opinion corresponding to the related PCT Patent Application No. CN2013/072655 dated Dec. 19, 2013.

*Primary Examiner* — Huan Hoang
(74) *Attorney, Agent, or Firm* — Brent Yamashita; DLA Piper LLP US

(57) ABSTRACT

An improved sensing circuit is disclosed that utilizes a bit line in an unused memory array to provide reference values to compare against selected cells in another memory array. A circuit that can perform a self-test for identifying bit lines with leakage currents about an acceptable threshold also is disclosed.

4 Claims, 4 Drawing Sheets

(51) Int. Cl.
*G11C 29/12* (2006.01)
*G11C 29/50* (2006.01)

(56) References Cited

U.S. PATENT DOCUMENTS

| | | |
|---|---|---|
| 5,910,914 A | 6/1999 | Wang |
| 5,963,494 A | 10/1999 | Khang |
| 6,141,277 A | 10/2000 | Tanzawa |
| 6,822,907 B2 | 11/2004 | Maruyama et al. |
| 7,813,201 B2 | 10/2010 | Fort et al. |
| 8,059,468 B2 | 11/2011 | Hendrickson et al. |
| 8,379,454 B2 | 2/2013 | Kochar |
| 9,159,452 B2 | 10/2015 | Yamada |
| 2005/0169095 A1* | 8/2005 | Bedeschi ............ G11C 7/12 365/232 |
| 2008/0170445 A1* | 7/2008 | Mori ............ G11C 29/02 365/189.07 |
| 2010/0027362 A1 | 2/2010 | Kang |
| 2010/0080070 A1* | 4/2010 | Parent ............ G11C 5/063 365/189.02 |
| 2012/0026818 A1 | 2/2012 | Chen |

FOREIGN PATENT DOCUMENTS

| | | |
|---|---|---|
| JP | H10-241386 A | 9/1998 |
| JP | 2000-090682 A | 3/2000 |

\* cited by examiner

HIGH SPEED AND LOW POWER SENSE AMPLIFIER

RELATED APPLICATIONS

This application is a divisional of U.S. application Ser. No. 14/772,734, filed on Sep. 3, 2015, which is a 371 of international PCT Patent Application No. PCT/CN2013/072655 filed on Mar. 15, 2013, which are incorporated herein by reference.

TECHNICAL FIELD

An improved sense amplifier for reading a non-volatile memory cell is disclosed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

Read operations usually are performed on floating gate memory cells using sense amplifiers. A sense amplifier for this purpose is disclosed in U.S. Pat. No. 5,386,158 (the "'158 patent"), which is incorporated herein by reference for all purposes. The '158 patent discloses using a reference cell that draws a known amount of current. The '158 patent relies upon a current mirror to mirror the current drawn by the reference cell, and another current mirror to mirror the current drawn by the selected memory cell. The current in each current mirror is then compared, and the value stored in the memory cell (e.g., 0 or 1) can be determined based on which current is greater.

Another sensing amplifier is disclosed in U.S. Pat. No. 5,910,914 (the "'914 patent"), which is incorporated herein by reference for all purposes. The '914 patent discloses a sensing circuit for a multi-level floating gate memory cell or MLC, which can store more than one bit of data. It discloses the use of multiple reference cells that are utilized to determine the value stored in the memory cell (e.g., 00, 01, 10, or 11).

Also known in the prior art are symmetrical memory bank pairs, where a memory system comprises two (or other multiple of two) memory arrays of equal size. Only one of the two banks is read from or written to at any particular time. In the prior art, a separate reference cell circuit typically is used to compare to the memory cell that is read, and that comparison is used to determine the value of the memory cell. This prior art system can be adversely affected by changes in the parasitic capacitance of the system.

What is needed is a sensing circuit with an improved designs for using bit lines in an unused memory array to provide reference values in a more reliable manner than in the prior art.

Another challenge in the prior art is that memory systems can provide incorrect values if there is significant leakage current caused by defects in one or more transistors.

What is needed is a memory system that can perform a self-test operation to identify bit lines in a memory system with leakage currents that exceed an acceptable threshold.

SUMMARY OF THE INVENTION

The aforementioned problems and needs are addressed through the use of sense circuits which compare the stored bits in one bank against bits generated by accessing the same bit line in the other bank with the word line deasserted, where the latter will provide reference values for use by the sense circuit in determining the values of the stored bits. In this approach, the bit lines used to provide the reference values typically change with each read operation as the read address change. This eliminates the need for separate reference cell circuits.

In another embodiment, the aforementioned problems and needs are addressed by utilizing a fixed bit line in an unused memory array to provide reference values to compare against selected cells in another memory array.

In another embodiment, a circuit that can perform a self-test for identifying bit lines with leakage currents about an acceptable threshold is disclosed.

DETAILED DESCRIPTION OF THE PREFERRED EMBODIMENTS

Figure 1:
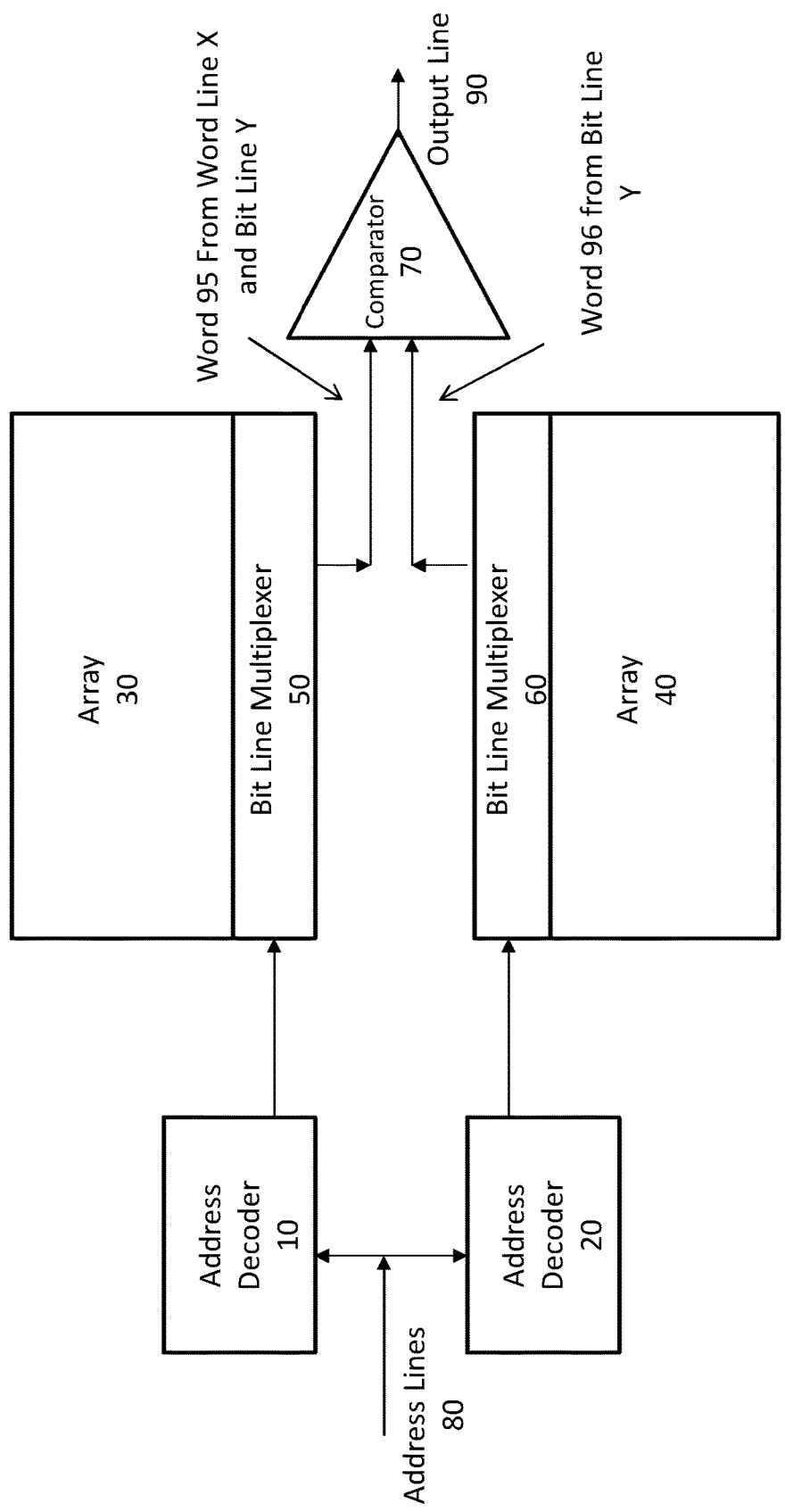
FIG. 1 depicts an embodiment of a memory array and improved sensing circuit.

An embodiment will now be described with reference to FIG. 1. Memory system 100 comprises array 30 and array 40, which typically are identical memory arrays of floating gate memory cells. Address lines 80 carry the address signals of the memory location to which the read or write operation applies. Address decoder 10 and address decoder 20 decode the address carried on address lines 80 and activate the appropriate word line and bit line in array 30 or array 40 so that a word of data is read from the correct location or a word of data is written to the correct location. As part of this operation, address decoder 10 controls bit line multiplexer 50, and address decoder 20 controls bit line multiplexer 60.

As an example, during a read operation of a particular address in array 30, the appropriate word line X and bit line Y will be activated in array 30, and bit line multiplexer 50 will output word 95 from that location in array 30 as an input to comparator 70. Concurrently, all word lines for array 40 are off, because the read operation does not involve array 40. The same bit line Y that was activated in array 30 is activated in array 40, and bit line multiplexer 60 outputs a word 96 from bit line Y as an input to comparator 70. Because no word line was activated for array 40, word 96 will not constitute data stored in array 40, but rather, represents a pre-charge voltage stored within bit line multiplexer 60. This voltage is used as a reference voltage by comparator 70. Comparator 70 will compare word 95 and word 96. One of ordinary skill in the art will understand that word 95 comprises one or more bits, and word 96 comprises one or more bits. Comparator 70 comprises a comparator circuit for each bit within word 95 and within word 96. That is, if word 95 and word 96 are 8 bits each, comparator 70 will comprise 8 comparator circuits, where each comparator circuit will compare one bit from word 95 with one bit at the same location within word 96. Output line 90 contains the result of the comparison of each bit pair.

If a bit within word 95 is higher than corresponding bit in word 96, then it is interpreted as a "0," and outline line 90 will contain a "0" at that location. If a bit within word 95 is equal to or lower than corresponding bit in word 96, then it is interpreted as a "1," and output line 90 will contain a "1" at that location.

One of ordinary skill in the art will appreciate that the embodiment of FIG. 1 requires a switching operation by bit line multiplexer 50 and bit line multiplexer 60 each time the bit line of the current address changes, which generally changes with each read operation.

Another embodiment will now be described with reference to FIG. 2. Many of the same structures from FIG. 1 are used, and if numbered the same as in FIG. 1, will not be described again. Address decoder 110 and address decoder 120 are modified versions of address decoder 10 and address decoder 20, respectively. Specifically, during a read operation, the address decoder that is associated with the array that is not being read will cause a fixed bit line to be activated within that array. In the same example discussed previously, bit line multiplexer 50 will still output word 95 from word line X and bit line Y (which is the word at the address that is desired to be read), but bit line multiplexer will now output word 97 from bit line Z, and will do so whenever data from any location is read from array 30. Because no word line was activated for array 40, word 96 will not constitute data stored in array 40, but rather, represents a pre-charge voltage stored within bit line multiplexer 60. Similarly, whenever data is read from any location in array 40, bit line multiplexer 50 will output a word from bit line Z. That is, the same bit line location is used for each comparison, which removes any switching operation and associated power consumption that would have been incurred in the embodiment of FIG. 1.

Bit line Z can be a "dummy" line that is never used with any actual memory location in array 30 or array 40, or it can be a bit line that is used with actual memory locations in array 30 or array 40. As with the embodiment of FIG. 1, memory system 200 uses comparator 70 to compare word 95 and word 96, with the resulting output appearing on output line 90.

The comparator 70 of FIGS. 1 and 2 will not be described with reference to FIG. 3. FIG. 3 depicts comparator 70 as to one bit. It is understood that this circuit can be duplicated for other bits. FIG. 3 assumes that the appropriate word line and bit line have been activated to select selected cell 330 for a read operation, which in this example can be a cell in array 30. Selected cell 340 is a cell in array 40 that corresponds to the same word line and bit line as selected cell 310 in array 30.

PMOS transistor 210 is a current mirror from a reference cell (not shown), and therefore mirrors the current that exists in the reference cell. PMOS transistor 230 is a cascade device for PMOS transistor 210. The source of PMOS transistor 210 and the source of PMOS transistor 220 each are connected to VDD, which is a voltage source. In this embodiment, VDD generates a voltage of 1.8 volts, but one or ordinary skill in the art will understand that VDD can generate other voltages. The drain of PMOS transistor 210 connects to the source of PMOS transistor 230.

PMOS transistor 220 and PMOS transistor 240 together form a "dummy" device that serves to perform parasitic load balancing with PMOS transistor 210 and PMOS transistor 230.

Selected cell 330 is the cell within memory array 30 that is to be read. Selected cell 340 is the cell within memory array 40 that also is "read," as described earlier for FIGS. 1 and 2. The difference in current between PMOS transistor 210 and selected cell 330 will charge or discharge node 320, depending on the value stored in selected cell 330. However, node 310 will remain unchanged, and therefore serves as a reliable reference point.

PMOS transistor 250 and PMOS transistor 260 are controlled by the ATDb signal, which is the complement of the Address Transition Detect (ATD) signal. The ATD signal is asserted at the beginning of a read cycle and can be used (elsewhere) to latch a new address for a read operation. Thus, PMOS transistor 250 and PMOS transistor 260 are turned on at the beginning of a read operation. The source of PMOS transistor 250 and the source of transistor 260 are connected to VBL, which is a voltage used during the pre-charge operation. In this embodiment, VBL generates a voltage in the range of 0.5-1.0 volts, but one of ordinary skill in the art will appreciate that other voltages can be used for VBL. Node 310 and node 320 are pre-charged at the beginning of a read operation when PMOS transistor 250 and PMOS transistor 260 are turned on. During that time, PMOS transistor 280 and NMOS transistor 270 also are turned on, as their gates are controlled by the ATDb and ATD signals, respectively, and this will connect nodes 320 and 310 through PMOS transistor 280 and NMOS transistor 270.

When PMOS transistor 250 and PMOS transistor 260 are turned off, node 310 and node 320 will hold a pre-charge voltage, and the parasitic capacitance of node 310 and the parasitic capacitance of node 320 will maintain that pre-charge voltage. After PMOS transistor 250 and PMOS transistor 260 are turned off, PMOS transistor 210 and PMOS transistor 220 are turned on. If selected cell 330 is storing a "0," then the voltage at node 320 will decrease from the pre-charge voltage to a voltage around 0 volts. If selected cell 330 is storing a "1," then the voltage at node 320 will increase from the pre-charge voltage to a voltage around VDD.

Node 320 and node 310 are inputs to comparator 290. If node 310 is greater than or equal to node 320, then comparator 290 will output a "0," which can be interpreted to mean that selected cell 330 is storing a "1." If node 310 is less than node 320, then comparator 290 will output a "1," which can be interpreted to mean that selected cell 330 is storing a "0."

Figure 2:
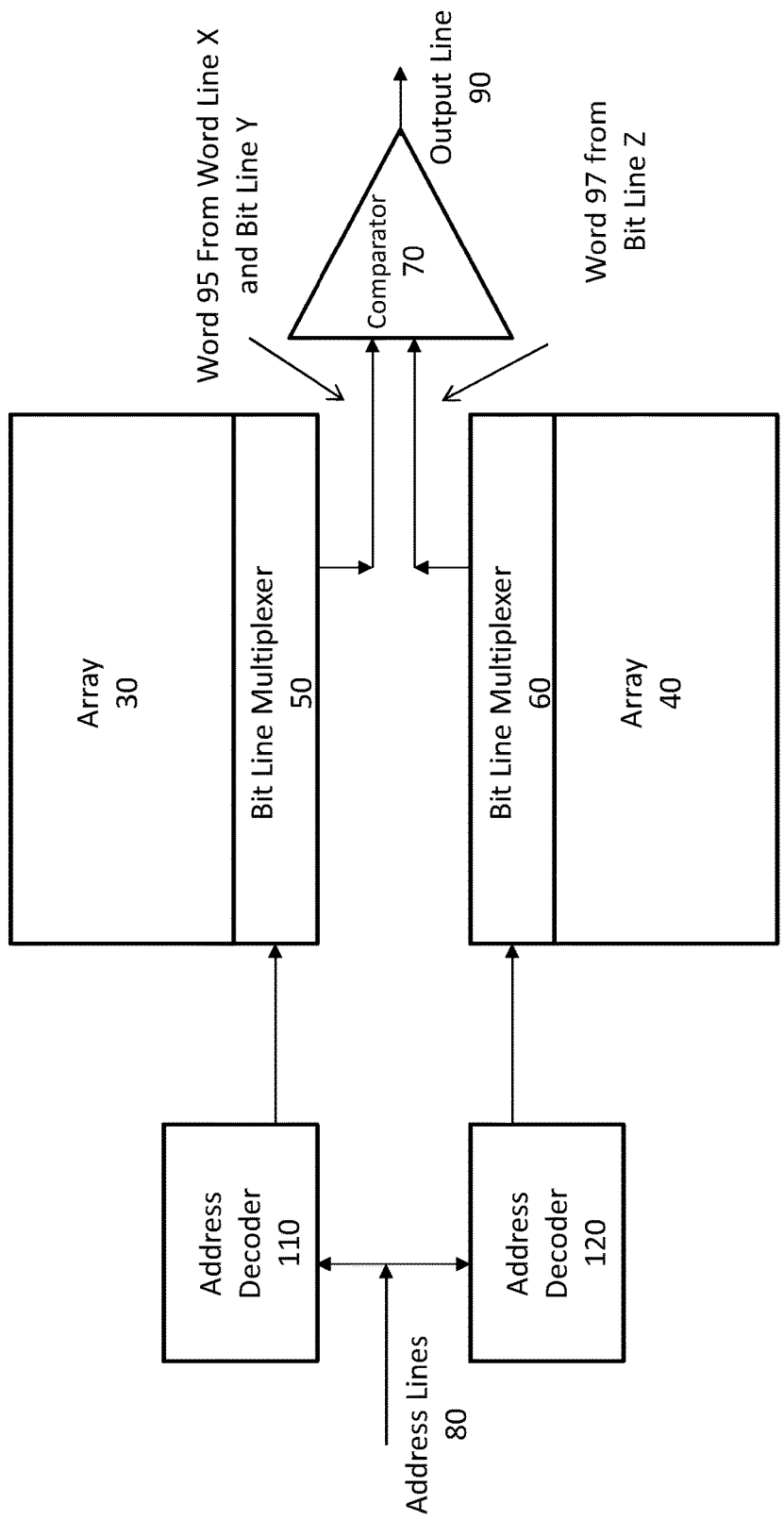
FIG. 2 depicts another embodiment of a memory array and improved sensing circuit.
Figure 3:
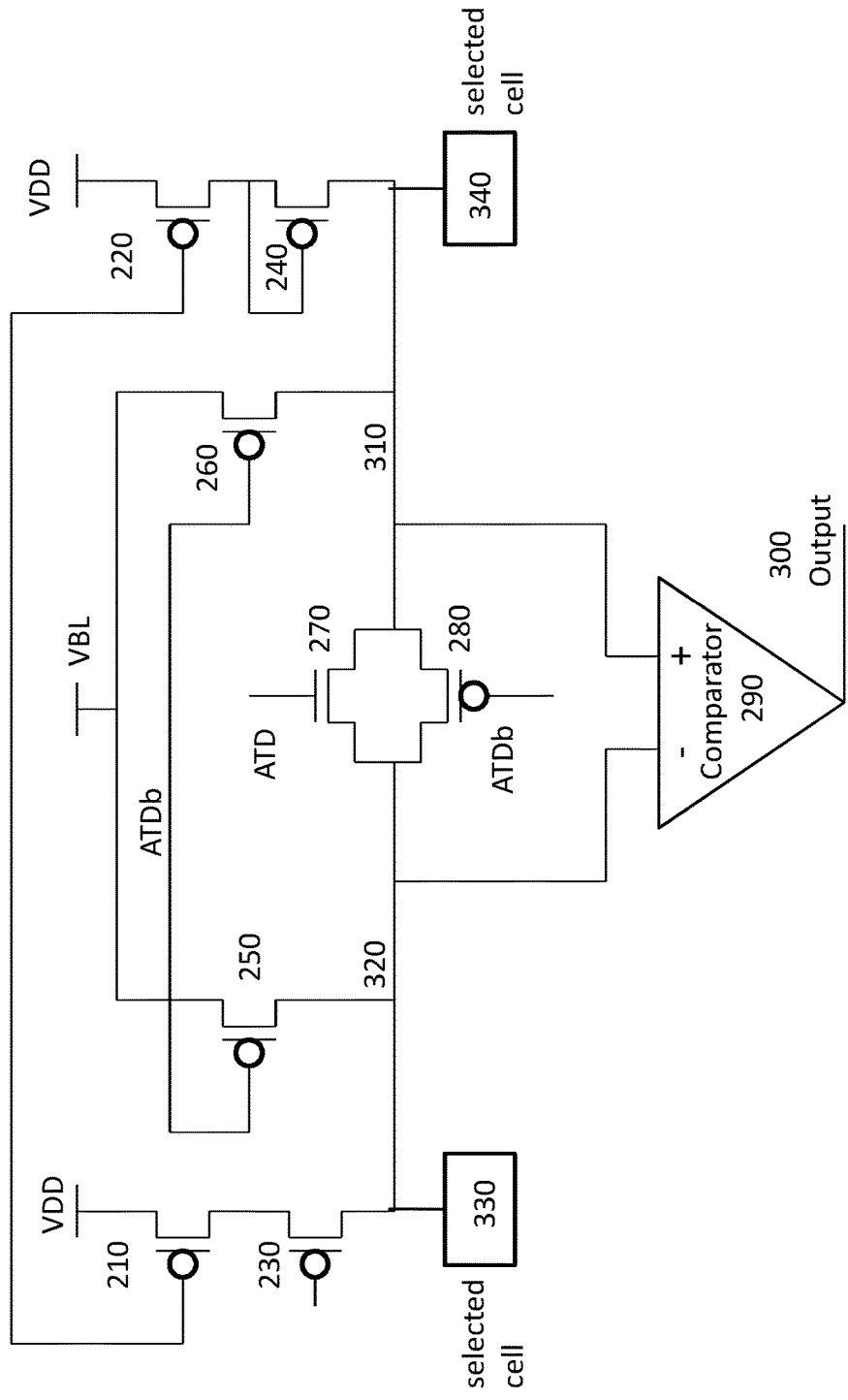
FIG. 3 depicts an embodiment of a sense circuit for one bit.

Thus, the system of FIGS. 2 and 3 is a sensing circuit that determines the bit stored in selected cell 330. A benefit is derived from using the same devices as the selected voltage/current (here, PMOS transistor 240 and selected cell 330 and identical structures for other cells in the same bit line). Additional power also is saved compared to prior art systems because this system does not use any bit line clamping circuits as in prior art systems.

The system of FIGS. 2 and 3 have the additional benefit of noise immunity. Because the arrays 30 and 40 are symmetrical and the sensing circuit of FIG. 3 is symmetrical, any common noise will be minimized.

Figure 4:
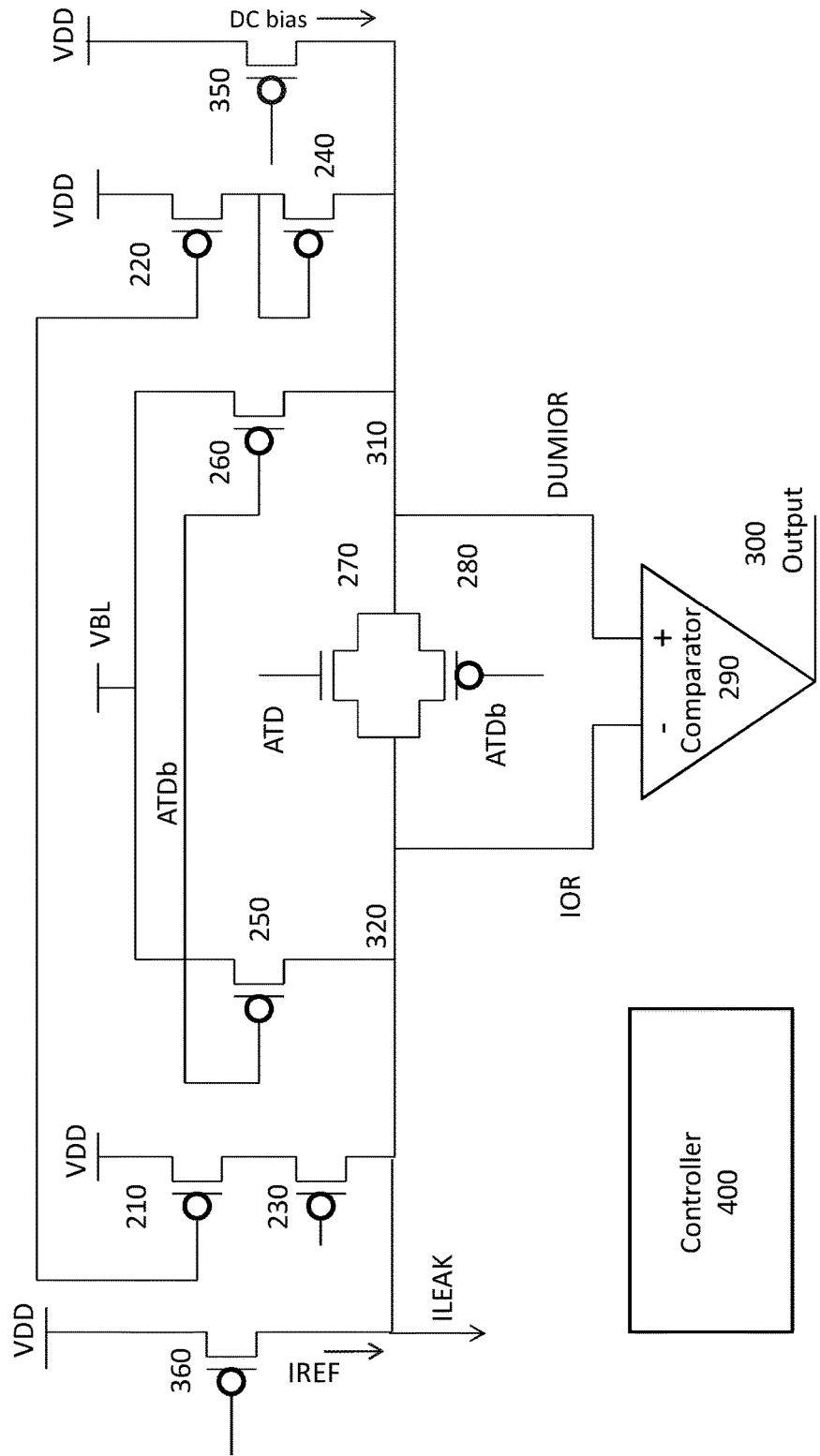
FIG. 4 depicts an embodiment of a sense circuit with self-test circuitry for identifying a bit line with unacceptable leakage current.

Another embodiment is depicted in FIG. 4. The system of FIG. 4 includes the components of FIG. 3, which are numbered as in FIG. 3 and which perform the same operations as in FIG. 3. The system of FIG. 4 also includes some additional components that can be used to identify bit lines that display unacceptable levels of leakage.

A self-test can be performed during manufacturing or operation in the field. In this mode, all memory cells are erased and all word lines are disabled. One bit line in each array is selected at a time, and the circuit of FIG. 4 is used to test one selected cell in each selected bit line. It will be understood that identical circuits can be used for every other bit within the selected bit line.

In the circuit of FIG. 4, PMOS transistor 350 is turned on and provides a DC bias to node 310. The source of PMOS transistor is connected to VDD, and its drain connects to node 310. PMOS transistor 360 provides a reference current, called IREF. The parameters of PMOS transistor 360 are chosen such that IREF equals the maximum level of current that is acceptable as a leakage current for a bit within a bit line. Because all memory cells have been erased, selected cell 330 will store a "0" and PMOS transistor will be turned on.

The reference current provided by PMOS transistor 360 is set to a level IREF, which can be set to be the maximum allowable level of leakage current for a selected bit line. The actual leakage of the selected bit line is current ILEAK. If there is no leakage in the selected bit line, then ILEAK will be 0 amps. During this self-test mode, PMOS transistor 210 and PMOS transistor 230 are turned off. The difference in current between IREF and ILEAK will charge or discharge node 320.

If ILEAK>IREF, then node 320 will discharge, and comparator 290 will then output a "1" at output 300, which indicates the presence of an unacceptable amount of leakage current. Controller 500 optionally is configured to record that particular bit line as an unusable bit line, and thereafter controller 400 would replace that bit line with another bit line, such as a redundant bit line, during operation.

If ILEAK <IREF, then node 330 will charge, and comparator 290 will output a "0" at output 300, which indicates the presence of an acceptable level of leakage current. Controller 400 optionally is configured to record that particular bit line as a usable bit line.

In this manner, every bit line within a memory array can be tested, and bit lines with unacceptable levels of leakage can be identified and avoided thereafter.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A system for detecting leakage current that exceeds a threshold reference current on a bit line in a memory system, comprising
    a first PMOS transistor comprising a source coupled to a voltage source and a drain for generating a threshold reference current;
    a memory cell coupled to the drain of the first PMOS transistor through a bit line at a first node, wherein the memory cell and the bit line draw a leakage current;
    a second PMOS transistor comprising a source coupled to the voltage source and a drain for generating a constant voltage at a second node; and
    a comparator that receives the first node as an input and the second node as an input and generates an output indicating if the leakage current exceeds the threshold reference current.

2. The system of claim 1, wherein the threshold reference current is a level of acceptable leakage current for the bit line.

3. The system of claim 1, further comprising a controller.

4. The system of claim 3, wherein the controller is configured to store an identifier of the bit line if the leakage current exceeds the threshold reference current.

* * * * *